(12) United States Patent
Matsumura

(10) Patent No.: US 10,634,438 B2
(45) Date of Patent: Apr. 28, 2020

(54) COOLING PLATE AND INFORMATION PROCESSING DEVICE

(71) Applicant: FUJITSU LIMITED, Kawasaki-shi, Kanagawa (JP)

(72) Inventor: Takayoshi Matsumura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/268,536

(22) Filed: Feb. 6, 2019

(65) Prior Publication Data

US 2019/0277585 A1    Sep. 12, 2019

(30) Foreign Application Priority Data

Mar. 7, 2018 (JP) .................................. 2018-040687

(51) Int. Cl.
*G06F 1/20* (2006.01)
*F28F 13/08* (2006.01)
*H01L 23/473* (2006.01)

(52) U.S. Cl.
CPC ................ *F28F 13/08* (2013.01); *G06F 1/20* (2013.01); *H01L 23/473* (2013.01); *G06F 2200/201* (2013.01)

(58) Field of Classification Search
CPC . H01L 23/473; H01L 23/427; H01L 23/4735; F28D 15/0266; F28D 15/0233; F28D 15/046; F28D 2021/0029; F28D 15/02; F28D 2021/0031; F28D 15/04; F28F 3/12; F28F 2265/10; H05K 7/20927; H05K 7/20809; H05K 7/20345; H05K 7/20936; H05K 7/20309; H05K 7/20318; H05K 7/20327; H05K 7/20336; H05K 7/20781

See application file for complete search history.

(56) References Cited

U.S. PATENT DOCUMENTS

| | | | | |
|---|---|---|---|---|
| 7,017,651 | B1* | 3/2006 | Wilson | H01L 23/473 165/109.1 |
| 8,797,741 | B2* | 8/2014 | Altman | F28F 3/12 165/104.33 |
| 2005/0178529 | A1* | 8/2005 | Suzuki | F28D 15/0233 165/80.4 |
| 2005/0286227 | A1* | 12/2005 | Erturk | H01L 23/427 361/702 |
| 2008/0087406 | A1* | 4/2008 | Asfia | F28D 15/0233 165/104.29 |

(Continued)

FOREIGN PATENT DOCUMENTS

JP    2014-183107    9/2014

*Primary Examiner* — Adam B Dravininkas
(74) *Attorney, Agent, or Firm* — Fujitsu Patent Center

(57) ABSTRACT

A cooling plate includes a main body portion including a cooling surface; a first flow path formed inside the main body portion and configured to receive a refrigerant from a pump side; a second flow path formed inside the main body portion and configured to discharge the refrigerant to the pump side; a third flow path provided closer to a side of the cooling surface than the first flow path and the second flow path in the main body portion and configured to couple the first flow path and the second flow path; and a reduced diameter portion formed in the third flow path and configured to narrow a flow path diameter of the third flow path.

16 Claims, 13 Drawing Sheets

(56) References Cited

U.S. PATENT DOCUMENTS

| | | | |
|---|---|---|---|
| 2009/0269521 A1* | 10/2009 | Tuma | C23C 18/08 428/32.74 |
| 2010/0096016 A1* | 4/2010 | Davis | F04B 19/006 137/1 |
| 2010/0328882 A1* | 12/2010 | Campbell | H01L 23/427 361/689 |
| 2011/0315343 A1* | 12/2011 | Campbell | F28D 15/0233 165/80.3 |
| 2012/0137718 A1* | 6/2012 | Uchida | H05K 7/20336 62/259.2 |
| 2013/0160974 A1* | 6/2013 | Uchida | F28D 15/0233 165/104.21 |
| 2013/0233521 A1* | 9/2013 | Uchida | F28D 15/0266 165/104.26 |
| 2014/0076522 A1* | 3/2014 | Olesen | H05K 7/20309 165/104.21 |
| 2016/0339761 A1* | 11/2016 | Enomoto | F25B 25/005 |
| 2016/0366793 A1* | 12/2016 | Kikuchi | H05K 7/20781 |
| 2017/0135247 A1* | 5/2017 | Ogata | H01L 23/427 |

* cited by examiner

COOLING PLATE AND INFORMATION PROCESSING DEVICE

CROSS-REFERENCE TO RELATED APPLICATION

This application is based upon and claims the benefit of priority of the prior Japanese Patent Application No. 2018-40687, filed on Mar. 7, 2018, the entire contents of which are incorporated herein by reference.

FIELD

The embodiments discussed herein are related to a cooling plate and an information processing device.

BACKGROUND

A cooling device includes an aspirator incorporated in a liquid circulation path.

Related art is disclosed in Japanese Laid-open Patent Publication No. 2014-183107.

SUMMARY

According to an aspect of the embodiments, a cooling plate includes a main body portion including a cooling surface; a first flow path formed inside the main body portion and configured to receive a refrigerant from a pump side; a second flow path formed inside the main body portion and configured to discharge the refrigerant to the pump side; a third flow path provided closer to a side of the cooling surface than the first flow path and the second flow path in the main body portion and configured to couple the first flow path and the second flow path; and a reduced diameter portion formed in the third flow path and configured to narrow a flow path diameter of the third flow path.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
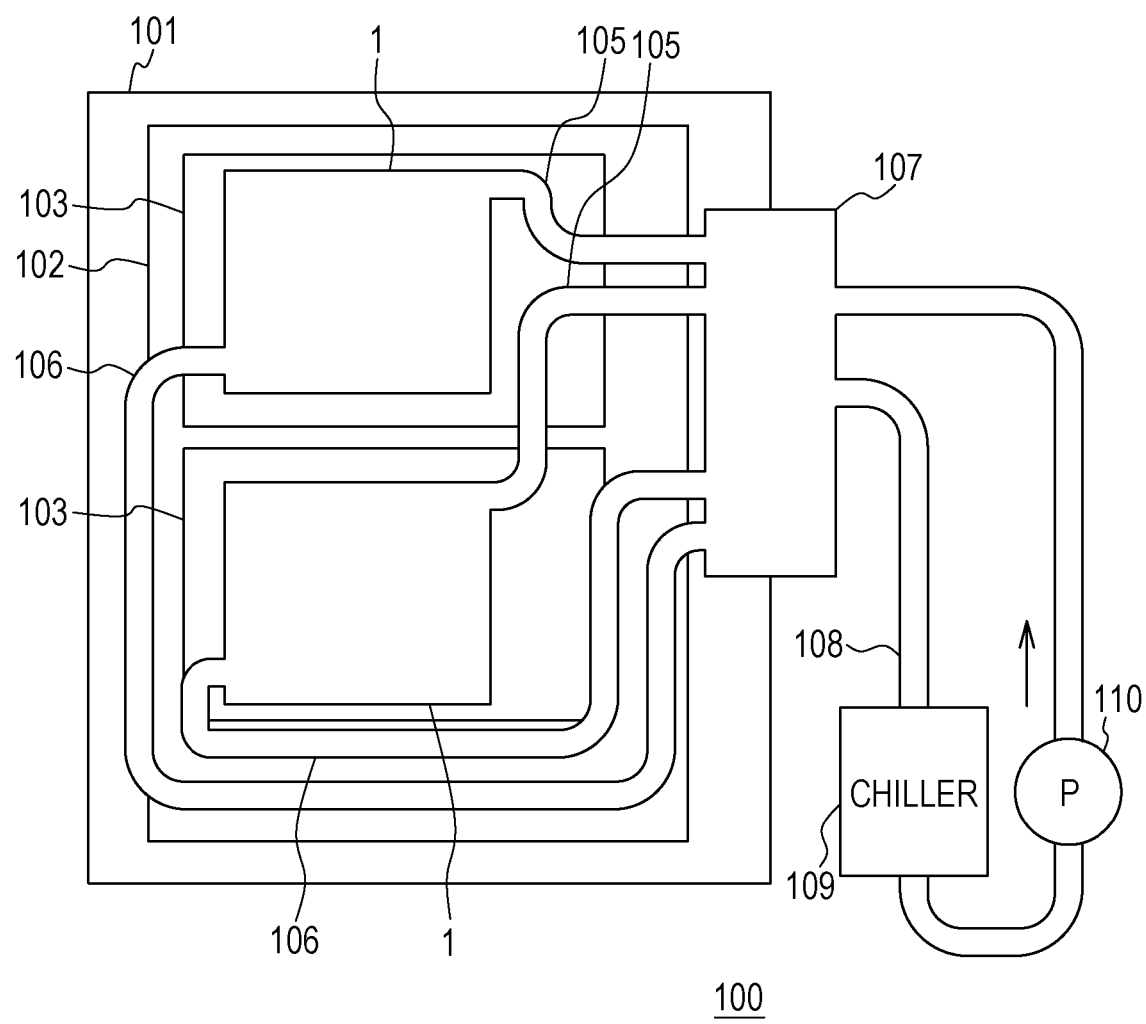
FIG. 1 is an explanatory diagram illustrating an outline of a configuration of an information processing device according to an embodiment.

For example, a cooling device in which a steam pipe extending from an evaporator that removes heat from a heat source is connected to an aspirator incorporated in a liquid circulation path. The evaporator that removes heat from a heat source is sometimes called a cooling plate or the like and demonstrates the cooling effect by latent heat when a liquid inside is heated by heat of the heat source to be nucleate boiling and the phase changes from a liquid to a gas.

For example, in an information processing devices, the size of a central processing unit (CPU) is reduced and a graphics processing unit (GPU) is mounted, which serve as heat sources; for this reason, the heat generation density is increasing. In order to cope with such a situation, improvement in cooling efficiency is also required for the cooling plate itself.

For example, the technology which improves cooling efficiency of a cooling plate may be provided.

Hereinafter, embodiments of the present invention will be described with reference to the accompanying drawings. Note that, in the drawings, the dimensions, ratios, and the like of respective portions are not illustrated so as to completely match the actual ones in some cases. In addition, in some drawings, there are cases where the actually existing constituent elements are omitted or the dimensions are drawn exaggeratedly than actually for the sake of convenience of the explanation.

First Embodiment

Figure 2A:
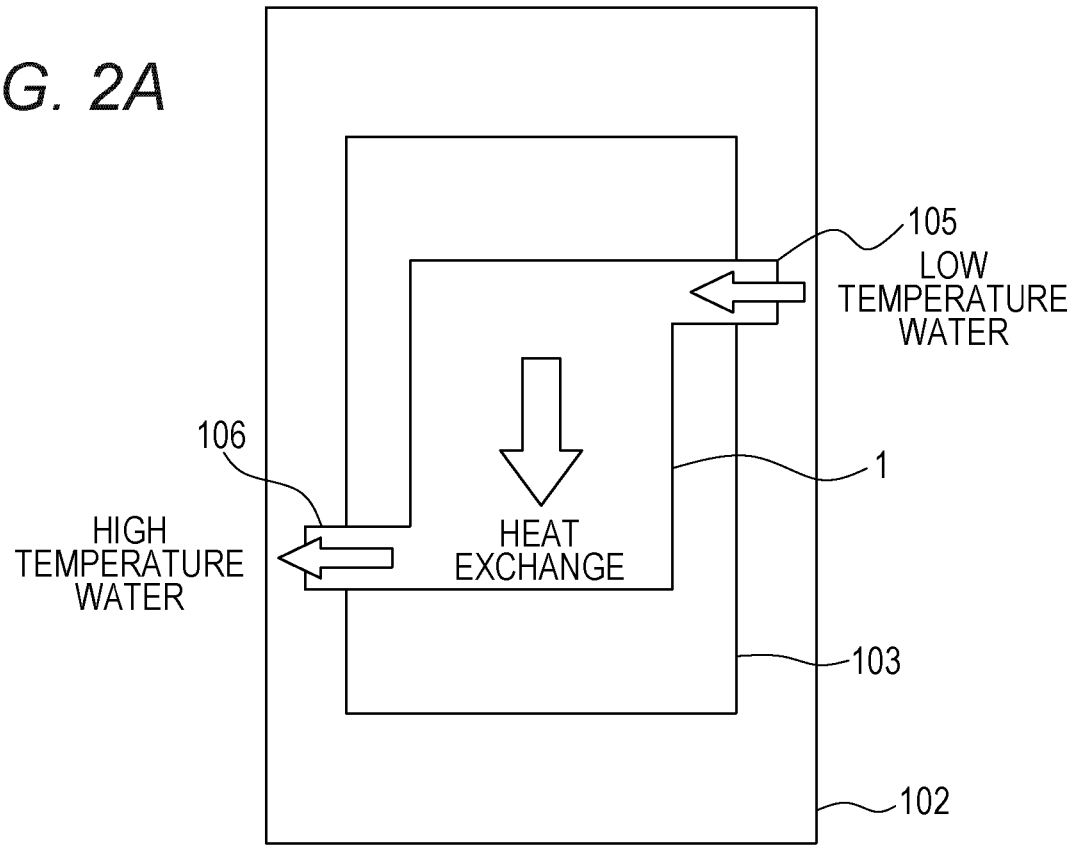
FIG. 2A is a plan view illustrating a cooling plate mounted on a substrate.
Figure 2B:
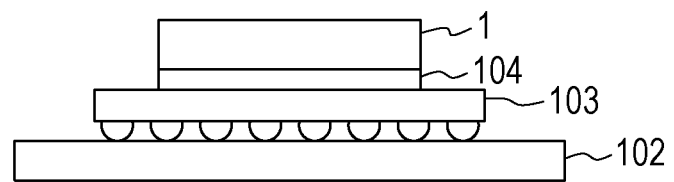
FIG. 2B is a side view illustrating the cooling plate mounted on the substrate.

With reference to FIGS. 1, 2A and 2B, an information processing device 100 of an embodiment has a substrate 102 installed on a frame 101. On the substrate 102, a package substrate (PKG substrate) 103 is mounted. On the PKG substrate 103, a CPU 104 that is a heat source and is to be cooled is mounted. The CPU 104 is an example of an object to be cooled. On the CPU 104, a cooling plate 1 is installed. The cooling plate 1 is provided with an inflow pipe 105 and a discharge pipe 106 for a refrigerant. A refrigerant W having a low temperature (low temperature water) flows into the cooling plate 1 from the inflow pipe 105. The refrigerant W after cooling the CPU 104 (high temperature water) is discharged from the discharge pipe 106. The inflow pipe 105 and the discharge pipe 106 are connected to a circulation path 108 via a distribution unit 107. The circulation path 108 is provided with a chiller 109 that cools the refrigerant W and a pump 110 that ejects the refrigerant W toward the cooling plate 1. The refrigerant W cooled by the chiller 109 is ejected toward the cooling plate 1 by the pump 110. Although the information processing device 100 of the present embodiment is a system board, the information processing device 100 may be another device. In addition, the CPU 104 is an example of an electronic component and any electronic component that generates heat can be regarded as an object to be cooled by the cooling plate 1. Furthermore, in the present embodiment, water is used as the refrigerant W, but another refrigerant such as ethanol may be used.

Figure 3:
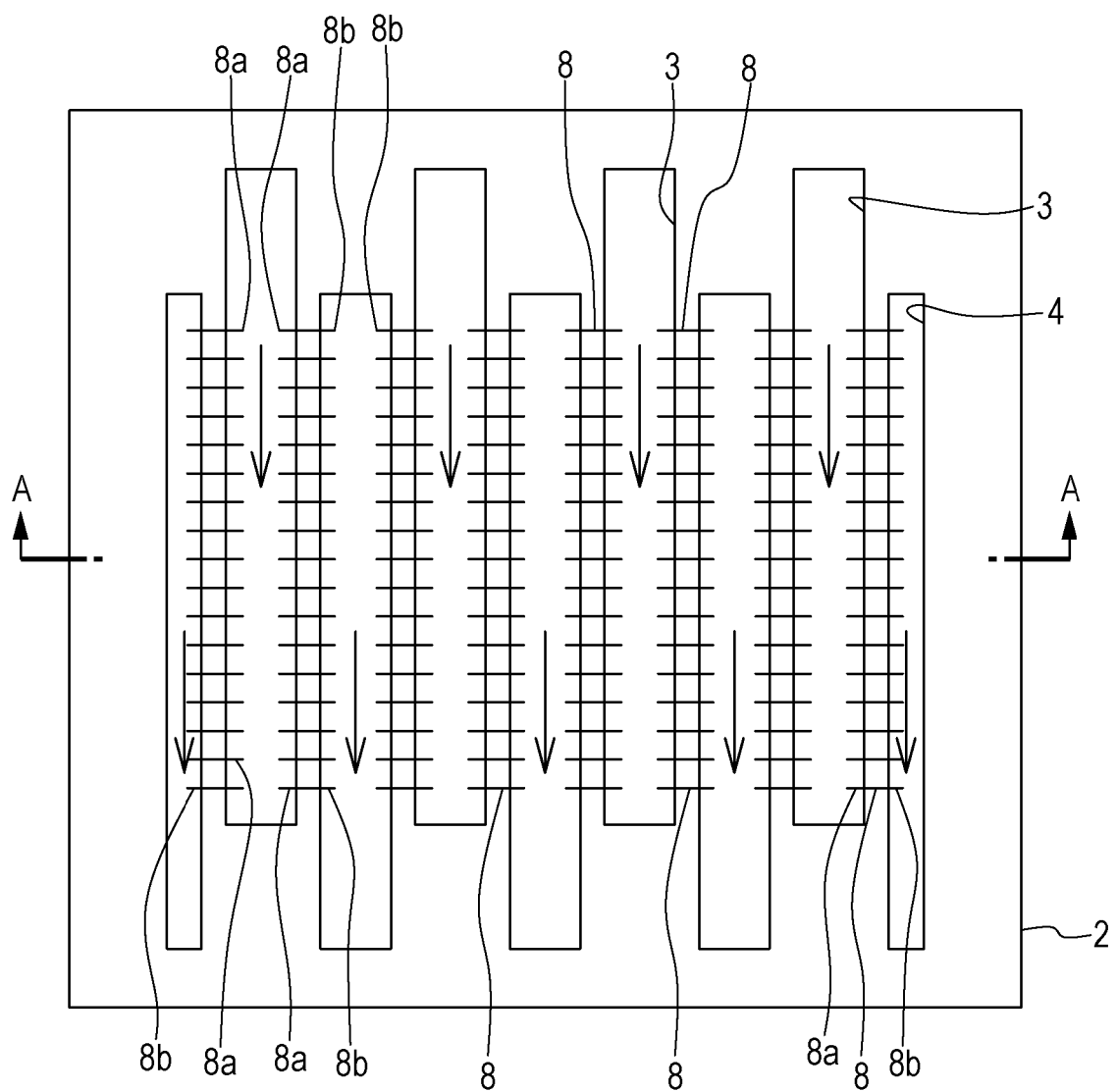
FIG. 3 is an explanatory view schematically illustrating an arrangement of flow paths in the cooling plate of the embodiment.
Figure 4:
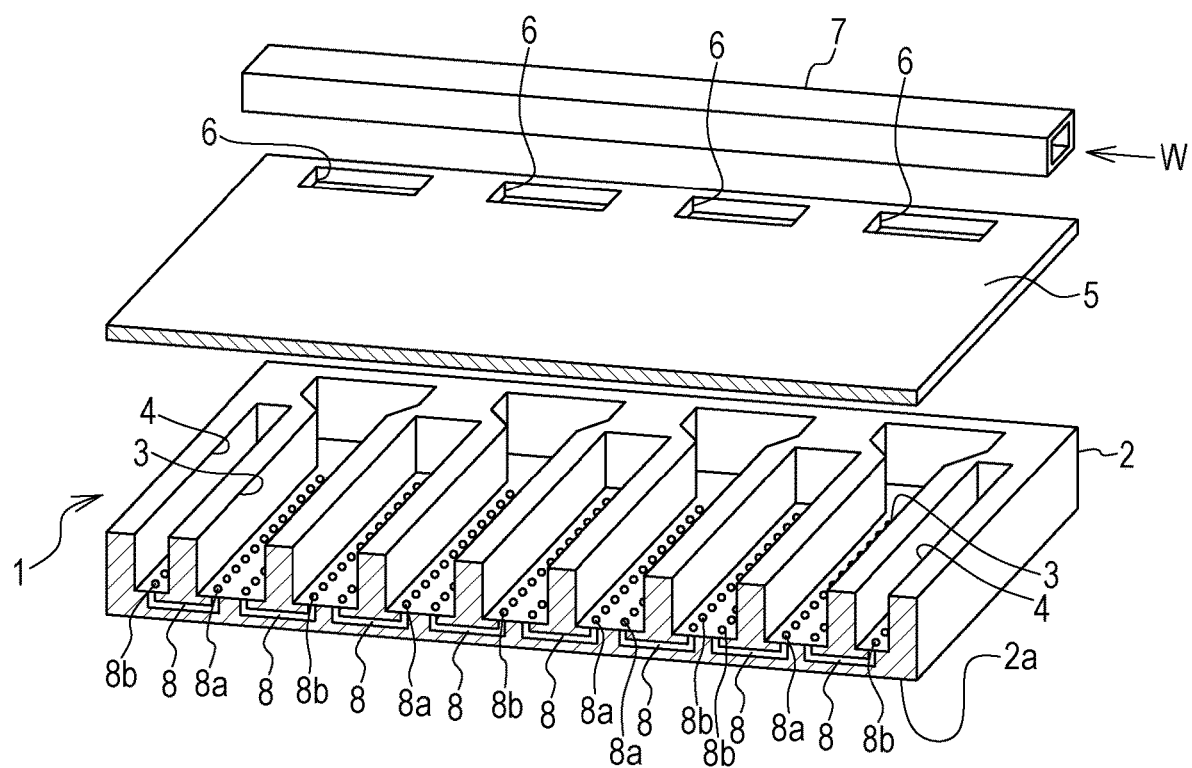
FIG. 4 is an explanatory view illustrating inside of the cooling plate of the embodiment.
Figure 5:
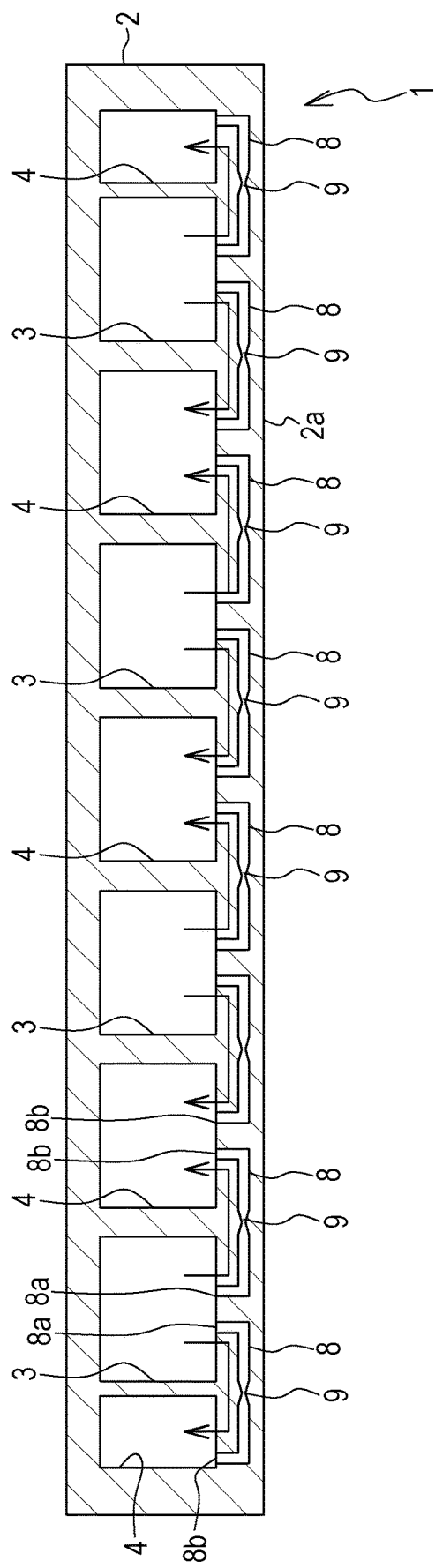
FIG. 5 is a cross-sectional view of the cooling plate of the embodiment.
Figure 6:
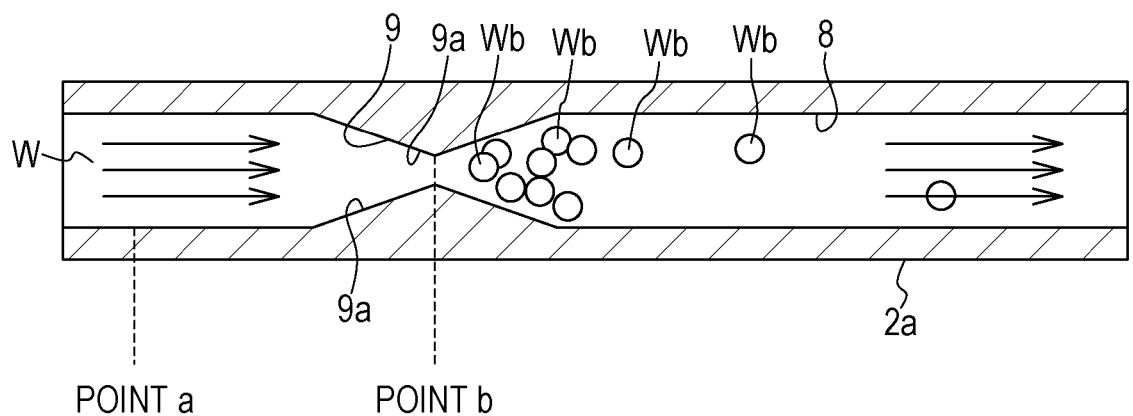
FIG. 6 is an explanatory view illustrating inside of a third flow path.

Next, the cooling plate 1 will be described in detail with reference to FIGS. 3 to 6. FIG. 3 is an explanatory view schematically illustrating the arrangement of flow paths in the cooling plate 1 of the embodiment. FIG. 4 illustrates a state in which a top plate portion 5 is separated from a main body portion 2 and a cross section is taken at a position corresponding to line A-A in FIG. 3, in order to clearly illustrate the condition of the inside of the cooling plate 1. FIG. 5 is a cross-sectional view taken along line A-A in FIG. 3. FIG. 6 is an explanatory view illustrating the inside of a third flow path 8.

With reference to FIGS. 3 and 4, the metal cooling plate 1 includes the main body portion 2 and the top plate portion 5 integrated with the main body portion 2. One surface of the main body portion 2 is prepared as a cooling surface 2*a*. The cooling surface 2*a* is a surface brought into contact with the CPU 104 to be cooled such that heat exchange with the CPU 104 is performed thereon. The cooling plate 1 of the present embodiment is made of copper, but the cooling plate 1 can be formed of another material. The top plate portion 5 can be bonded to the main body portion 2 by, for example, diffusion bonding.

A first flow path 3 into which the refrigerant W ejected by the pump 110 flows and a second flow path 4 that discharges the refrigerant W to the side of the pump 110 are provided inside the main body portion 2. The first flow path 3 and the second flow path 4 are provided in parallel and extend in the same direction. The first flow path 3 and the second flow path 4 are provided such that the refrigerant W flows in the same direction as indicated by arrows in FIG. 3. The first flow paths 3 and the second flow paths 4 are alternately arrayed in a direction orthogonal to a flow direction indicated by the arrows in FIG. 3.

A refrigerant inflow hole 6 is provided in an upstream portion of the top plate portion 5 for each first flow path 3. The refrigerant W flows into each first flow path 3 from a refrigerant distribution pipe 7 coupled to the inflow pipe 105 of the refrigerant W through the refrigerant inflow hole 6. The refrigerant W having a low temperature (low temperature water) flows in the first flow path 3, while the refrigerant W after cooling the CPU 104 (high temperature water) flows in the second flow path 4.

The adjacent first flow path 3 and second flow path 4 are connected by the third flow path 8. The third flow path 8 is a microchannel and is provided on a side closer to the cooling surface 2*a* than the first flow path 3 and the second flow path 4 in the main body portion 2. When the cooling plate 1 is installed on the CPU, the third flow path 8 is provided under the first flow path 3 and the second flow path 4. A first end portion 8*a* of the third flow path 8 is located within the first flow path 3. A second end portion 8*b* of the third flow path 8 is located within the second flow path 4. The first end portion 8*a* opens into the first flow path 3 and serves as an entrance of the third flow path 8. The second end portion 8*b* opens into the second flow path 4 and serves as an exit of the third flow path 8. The second end portion 8*b* corresponds to a flow path end portion where the third flow path 8 merges with the second flow path 4.

A plurality of the third flow paths 8 are provided along the flow direction of the refrigerant W in the first flow path 3 and the second flow path 4. Therefore, a row of the first end portions 8*a* is formed within the first flow path 3 along the flow direction of the refrigerant W. In addition, a row of the second end portions 8*b* is formed within the second flow path 4 along the flow direction of the refrigerant W.

With reference to FIG. 5, a reduced diameter portion 9 that narrows a flow path diameter of the third flow path 8 is provided in each third flow path 8. The reduced diameter portion 9 of the present embodiment is formed by projecting portions 9*a* each obtained by projecting an inner peripheral wall of the third flow path 8 toward a center portion of the third flow path 8.

When the reduced diameter portion 9 is provided within the third flow path 8, bubbles Wb are produced in the refrigerant W as the refrigerant W passes through the reduced diameter portion 9, as illustrated in FIG. 6. This may mean that the refrigerant W is brought into a boiling state. Since the refrigerant W removes heat from the surroundings by latent heat when the refrigerant W is brought into a boiling state, the temperature of the refrigerant W decreases and the cooling efficiency is enhanced.

Figure 7A:
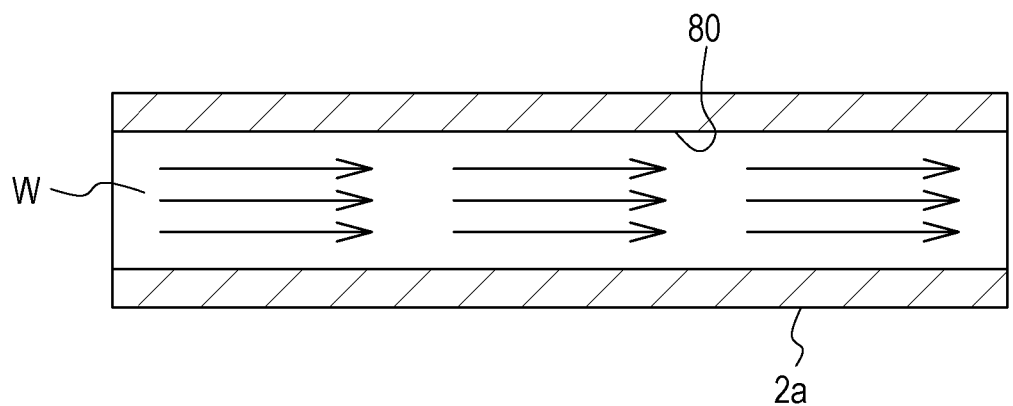
FIG. 7A is an explanatory view illustrating a flow of a refrigerant in a third flow path of a comparative example.

Here, the operation of the reduced diameter portion 9 will be described with reference to FIGS. 7A to 10B. FIG. 7A schematically represents the condition of the refrigerant W moving through a flow path 80 of a comparative example. Since the flow path diameter of the flow path 80 is fixed, when the condition for moving the refrigerant W is fixed, for example, when the ejection amount of the pump 110 is fixed, the flow velocity of the refrigerant W moving through the flow path 80 is fixed and the pressure of the refrigerant within the flow path 80 is also fixed.

Figure 7B:
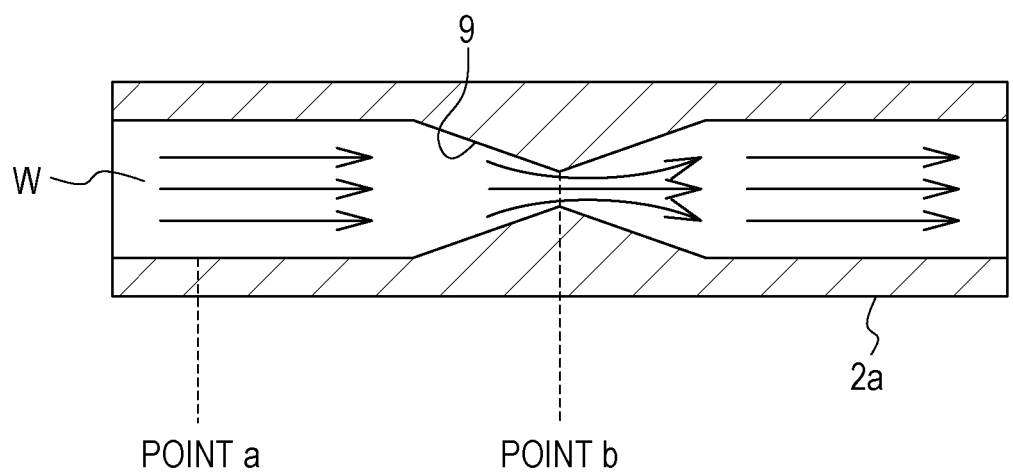
FIG. 7B is an explanatory view illustrating a flow of a refrigerant in the third flow path of the embodiment.

In contrast, if the reduced diameter portion 9 is provided as in the third flow path 8 illustrated in FIG. 7B, the flow velocity of the refrigerant W at point b on the reduced diameter portion 9 is high, as compared with the flow velocity at point a on the upstream side of the reduced diameter portion 9. Point b is a point having the narrowest flow path diameter in the reduced diameter portion 9 and the flow velocity immediately after passing through point b is the highest.

When the flow velocity of the refrigerant W becomes higher, the pressure of the refrigerant W decreases according to the Bernoulli's theorem indicated by Formula 1 and the law of constant flow rate indicated by Formula 2.

$$\rho Ua/2 + \rho gh + Pa = \rho Ub/2 + \rho gh + Pb \quad \text{Formula 1}$$

$$Aa \times Ua = Ab \times Ub \quad \text{Formula 2}$$

Ua: refrigerant flow velocity at point a, Ub: refrigerant flow velocity at point b Pa: refrigerant pressure at point a, Pb: refrigerant pressure at point b Aa: flow path area at point a, Ab: flow path area at point b ρ: refrigerant density g: gravitational acceleration h: potential head Here, since the relationship of Aa>Ab is satisfied because the reduced diameter portion 9 is provided, the relationship of Pa>Pb holds.

Figure 8A:
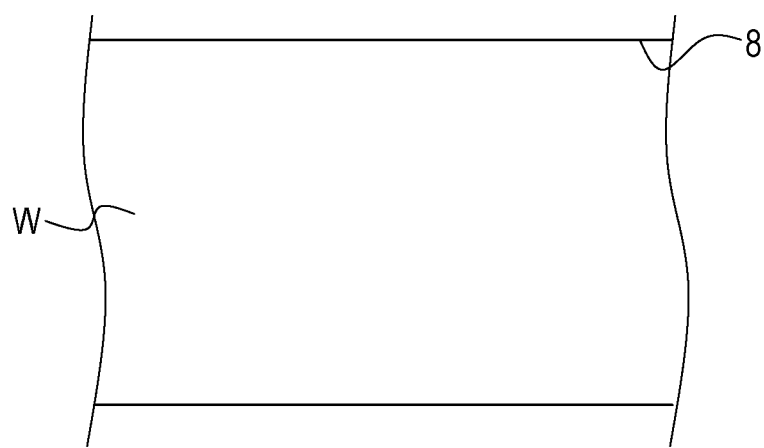
FIG. 8A is an explanatory view illustrating a condition of a refrigerant before decompression.
Figure 8B:
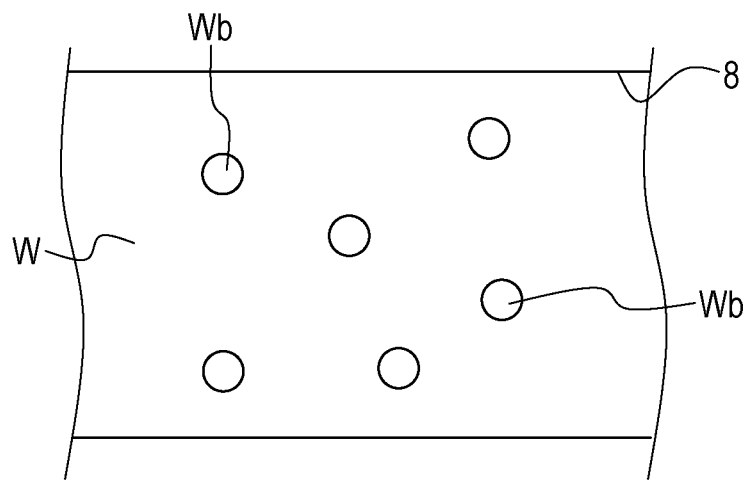
FIG. 8B is an explanatory view illustrating a condition of the refrigerant after decompression.
Figure 8C:
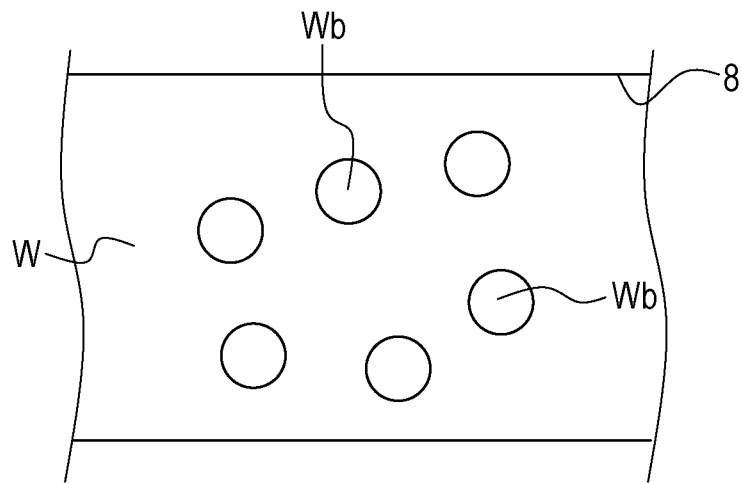
FIG. 8C is an explanatory view illustrating a condition of the refrigerant after further decompression.

FIG. 8A illustrates the condition of the refrigerant W before decompression and FIG. 8B illustrates the condition of the refrigerant W after decompression. FIG. 8C is an explanatory view illustrating the condition of the refrigerant W after further decompression. As illustrated in FIG. 8B, when the refrigerant W is decompressed, bubbles Wb are produced in the refrigerant W to demonstrate a cooling effect; when the refrigerant W is further decompressed as illustrated in FIG. 8C, the bubbles Wb grows to further enhance the cooling efficiency.

Figure 9:
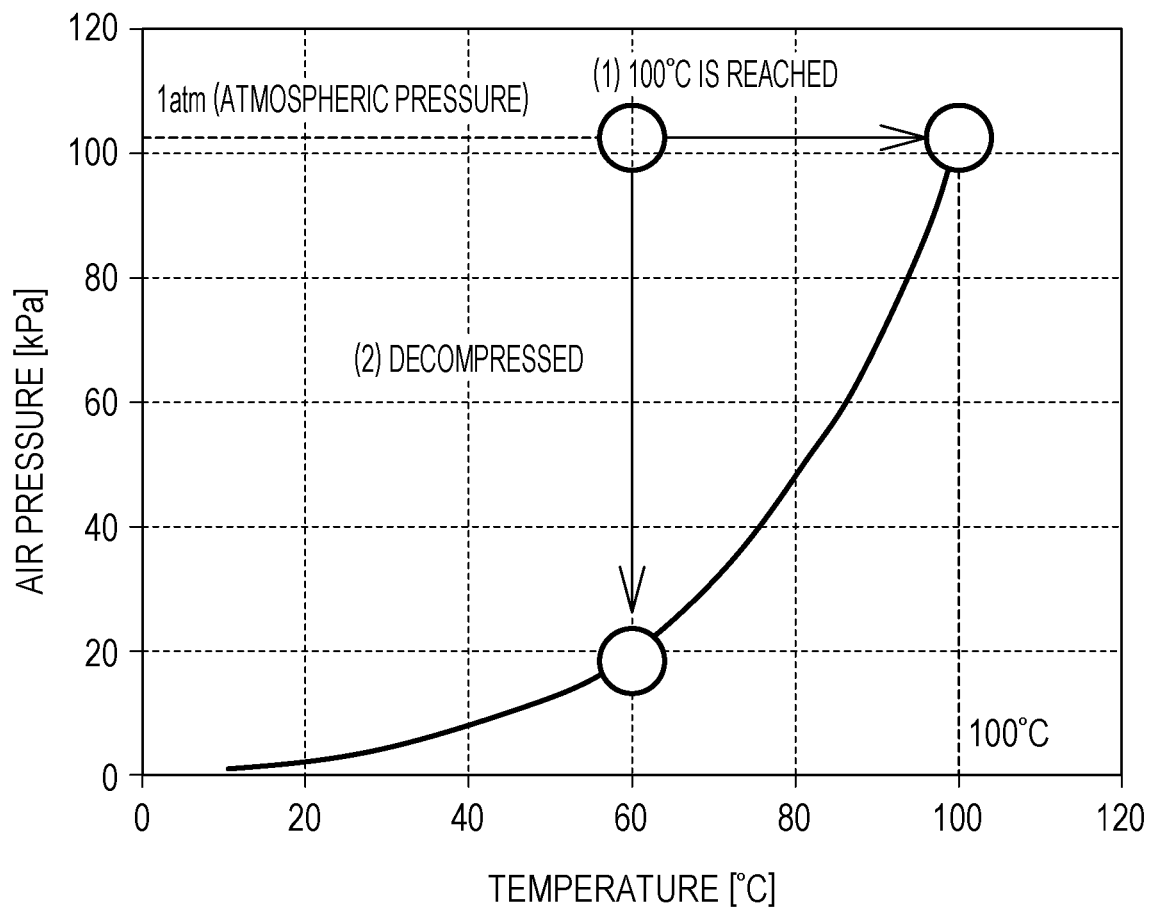
FIG. 9 is a saturated water vapor curve of a refrigerant in the embodiment.

With reference to FIG. 9, a saturated water vapor curve of water that is the refrigerant W is indicated. Water boils at 100° C. under the atmospheric pressure (1 atm, 101.325 kPa) environment, but the boiling temperature can be lowered by decreasing the pressure. Thus, in the present embodiment, the pressure Pb is decreased by providing the reduced diameter portion 9 such that the boiling temperature is decreased. The extent to which Pb is decreased is determined in consideration of the working temperature of the CPU 104 to be cooled. Assuming that the working temperature of the CPU 104 is around 60° C., the flow path diameters at points a and b are determined such that the pressure Pb becomes approximately 20 kPa or less. When a substance other than water is adopted as the refrigerant W, the flow path diameters at points a and b are appropriately set on the basis of the saturated water vapor curve of that refrigerant W such that the pressure Pb becomes lower than the saturated water vapor pressure.

In the cooling plate 1 of the present embodiment, the reduced diameter portion 9 is provided within the third flow path 8 provided at a position close to the cooling surface 2a and, by generating the bubbles Wb in the third flow path 8, the temperature of the refrigerant W is lowered in the third flow path 8 to improve the cooling efficiency.

Modifications

Figure 10A:
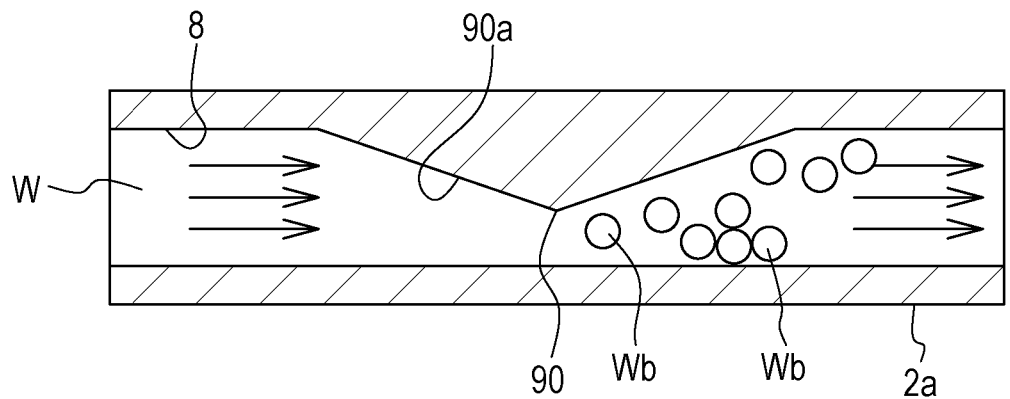
FIG. 10A is an explanatory view illustrating an example of a projecting portion.

Here, a reduced diameter portion 90 which is a modification of the reduced diameter portion 9 will be described with reference to FIG. 10A. In the reduced diameter portion 9 of the example illustrated in FIG. 6 and other drawings, when the third flow path 8 is taken as a cross section, the projecting portion 9a is projected from a side close to the cooling surface 2a toward a center side of the third flow path 8 and additionally another projecting portion 9a is also projected from a side opposing the aforementioned side. In contrast, in the reduced diameter portion 90 illustrated in FIG. 10A, a projecting portion 90a is projected from a side away from the cooling surface 2a toward the center portion of the third flow path 8. When the flow path diameter of the reduced diameter portion 90 is made to match the flow path diameter of the reduced diameter portion 9, the projecting amount of the projecting portion 90a is larger than the projecting amount of the projecting portion 9a. In such a form, the wall thickness on the side of the cooling surface 2a becomes thinner and the thermal resistance becomes smaller, such that the cooling efficiency improves.

Figure 10B:
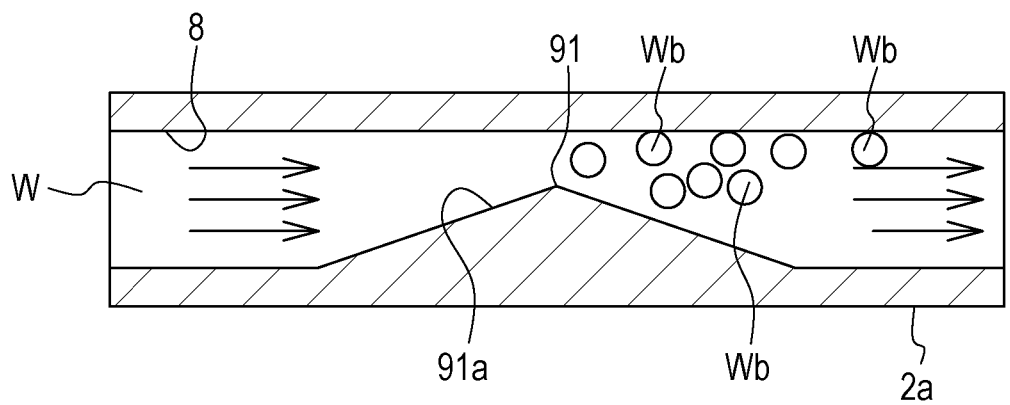
FIG. 10B is an explanatory view illustrating another example of the projecting portion.

Next, a reduced diameter portion 91 which is another modification of the reduced diameter portion 9 will be described with reference to FIG. 10B. In the reduced diameter portion 91 illustrated in FIG. 10B, a projecting portion 91a is projected from the side close to the cooling surface 2a toward the center portion of the third flow path 8. When the flow path diameter of the reduced diameter portion 91 is made to match the flow path diameter of the reduced diameter portion 9, the projecting amount of the projecting portion 91a is larger than the projecting amount of the projecting portion 9a. In such a form, the generated bubbles Wb are likely to gather on the side away from the cooling surface 2a. Since the bubbles Wb decrease the efficiency of heat exchange, if the bubbles Wb gather on the side close to the cooling surface 2a, it is conceivable that the cooling efficiency decreases. Accordingly, by providing the projecting portion 91a on the side close to the cooling surface 2a, the bubbles Wb are collected on the side away from the cooling surface 2a and the cooling efficiency may be improved.

It is possible to appropriately select which form to adopt from the reduced diameter portions 9, 90, and 91 according to the installation environment of the cooling plate 1, and the like.

Second Embodiment

Next, a second embodiment will be described with reference to FIGS. 11 to 14. Constituent elements common to the first embodiment are denoted by the same reference numerals in the drawings and detailed description thereof will be omitted.

Figure 11:
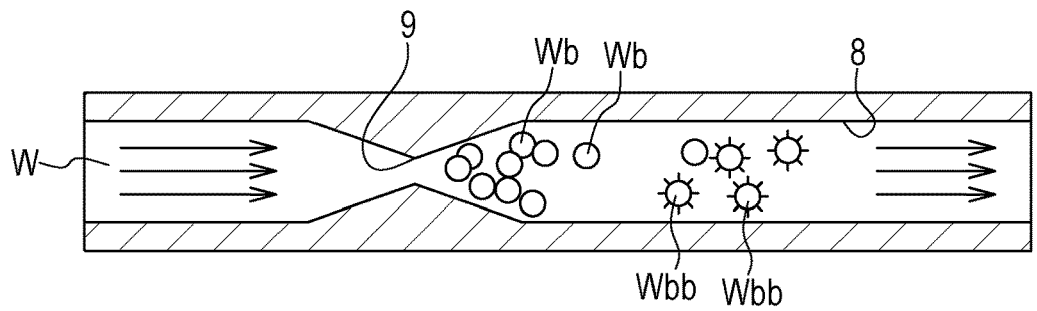
FIG. 11 is an explanatory view illustrating a condition in which bubbles burst.

First, the behavior of the bubbles Wb in a third flow path 8 will be described with reference to FIG. 11. Upon passing through a reduced diameter portion 9, the refrigerant W generates bubbles Wb immediately thereafter. For this reason, it is supposed that the cooling effect owing to the generation of the bubbles Wb is enjoyed from an area immediately ahead of the reduced diameter portion 9 to a predetermined range downstream of the reduced diameter portion 9. However, on the downstream side of the reduced diameter portion 9, the flow path diameter is restored. For this reason, the pressure is restored and becomes higher on the downstream side of the reduced diameter portion 9. As a result, the bubbles Wb are crushed by pressure and become burst bubbles Wbb. The phenomenon that the bubble Wb is crushed by pressure and becomes the burst bubble Wbb is condensation and raises the temperature of the refrigerant W. The bubble Wb generated by passing through the reduced diameter portion 9 is crushed by pressure at a position away from the reduced diameter portion 9 on the flow of the refrigerant W; depending on the flow velocity of the refrigerant W, however, it is presumed that the bubble Wb is crushed by pressure in the downstream vicinity of the reduced diameter portion 9, where the cooling effect is desired. For example, when the flow velocity of the refrigerant W is low, it is presumed that it takes time for the bubble Wb to proceed away from the downstream vicinity of the reduced diameter portion 9, where the cooling effect is desired; as a consequence, the bubble Wb is crushed by pressure in the downstream vicinity of the reduced diameter portion 9 and the temperature of the refrigerant W is raised.

Figure 12:
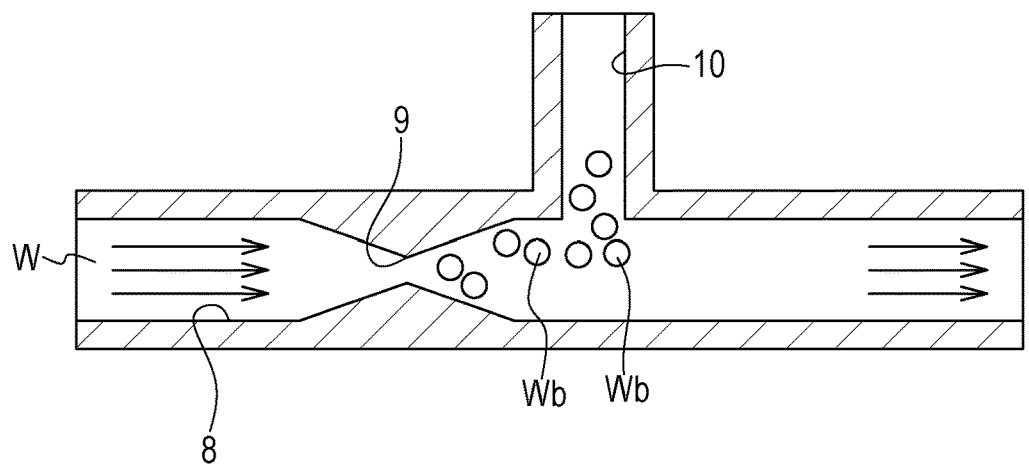
FIG. 12 is an explanatory view illustrating an arrangement of a bubble discharge flow path.

Accordingly, as a countermeasure for rise in temperature due to such burst bubbles Wbb, it is conceivable to provide a bubble discharge flow path 10 as illustrated in FIG. 12. The bubble discharge flow path 10 is provided in the downstream vicinity of the reduced diameter portion 9 and promptly discharges the generated bubbles Wb from the third flow path 8. The bubble discharge flow path 10 uses the buoyancy of the bubble Wb to discharge the bubble Wb from the third flow path 8. Although the bubble discharge flow path 10 illustrated in FIG. 12 extends in a vertical direction from the third flow path 8, as long as a flow path through which the bubble Wb can be raised by its buoyancy is implemented, the bubble discharge flow path 10 does not have to extend in the vertical direction but, for example, may extend obliquely upward.

Figure 13:
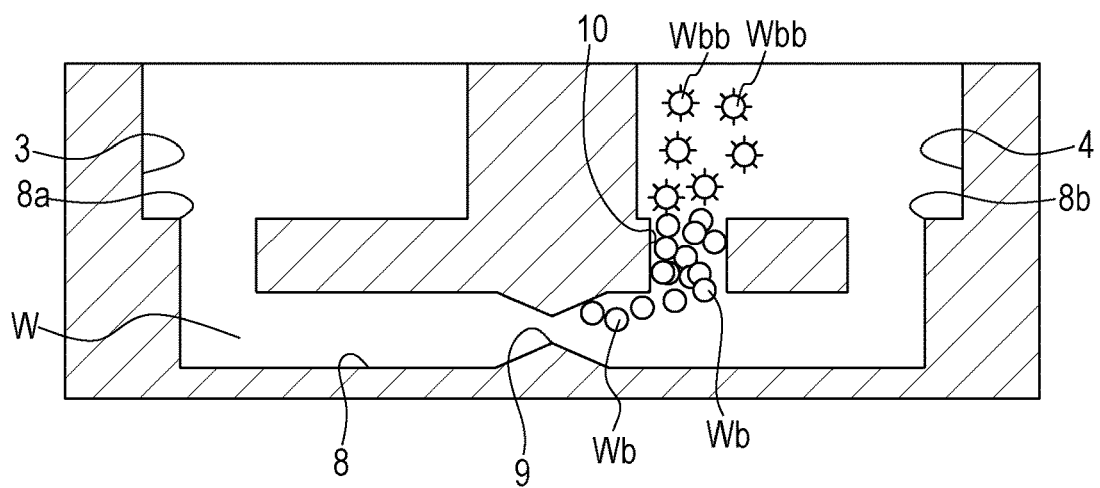
FIG. 13 is an explanatory view illustrating a positional relationship between a flow path end portion where the third flow path merges with a second flow path and the bubble discharge flow path.

Next, an embodiment incorporating such a bubble discharge flow path 10 will be described with reference to FIG. 13. With reference to FIG. 13, the bubble discharge flow path 10 is provided between the reduced diameter portion 9 provided within the third flow path 8 and a second end portion 8b which is a flow path end portion where the third flow path 8 merges with a second flow path 4. By arranging the bubble discharge flow path 10 in this manner, the bubble Wb generated as the refrigerant W passes through the reduced diameter portion 9 is instantly discharged to the second flow path 4 through the bubble discharge flow path 10. Since the refrigerant W having a high temperature after contributing to the cooling of the CPU 104 is moving in the second flow path 4, the cooling effect on the cooling surface 2a will not be decreased even if the bubble Wb discharged to the second flow path 4 becomes the burst bubble Wbb within the second flow path 4.

Figure 14:
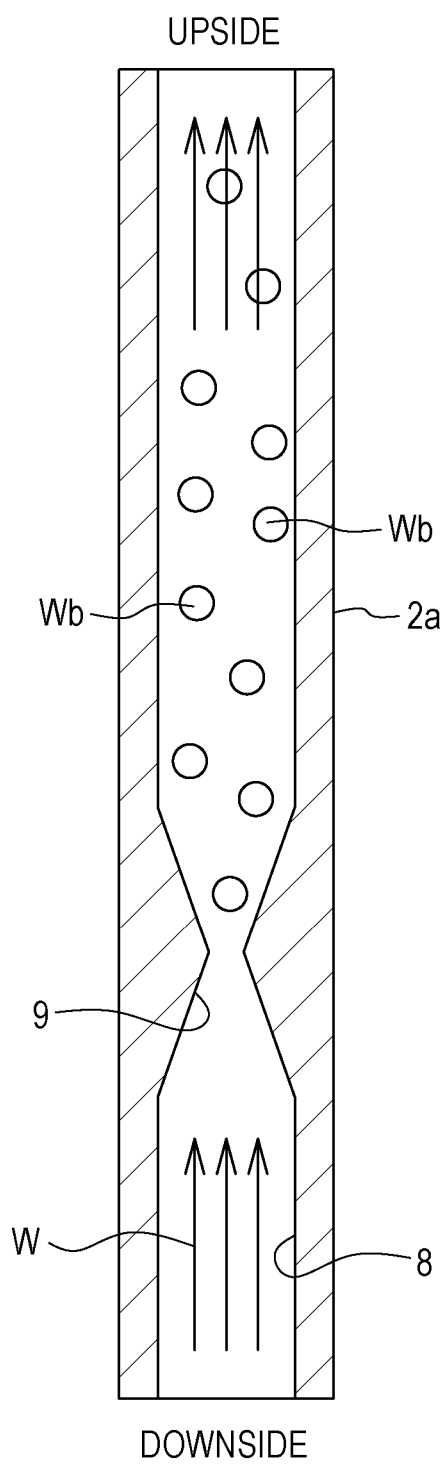
FIG. 14 is an explanatory view illustrating a state in which the third flow path is arranged along an up-down direction.

As illustrated in FIG. 14, when the third flow path 8 is placed longitudinally, the generated bubble Wb proceeds away from the reduced diameter portion 9 by its buoyancy and is not crushed by pressure in the downstream vicinity of the reduced diameter portion 9; therefore, no special measures are required.

Third Embodiment

Figure 15:
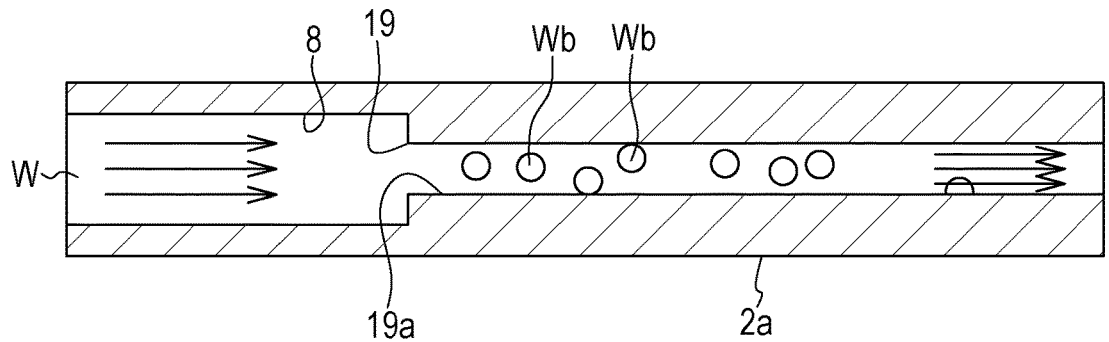
FIG. 15 is an explanatory view illustrating a reduced diameter maintaining portion.

Next, a reduced diameter portion 19 of a third embodiment will be described with reference to FIG. 15. The reduced diameter portion 19 of the third embodiment is formed by a reduced diameter maintaining portion 19a that maintains a reduced diameter state of the flow path diameter toward the downstream side of a third flow path 8 after the flow path diameter is reduced. The bubble Wb is produced due to a decrease in pressure caused by the flow velocity of the refrigerant W becoming higher because of the reduction of the flow path diameter; however, when the flow path diameter is expanded thereafter, the pressure is restored and the bubble Wb is crushed by pressure. In view of this action, in the third embodiment, by maintaining the flow path diameter such that the pressure of the refrigerant W is not restored, crush of the bubble Wb by pressure is suppressed as a countermeasure for rise in temperature of the refrigerant W.

Fourth Embodiment

Next, a fourth embodiment will be described with reference to FIG. 16. In the fourth embodiment, a first flow path 3 includes a reduced diameter portion 20 that narrows the flow path diameter of the first flow path 3. By generating the bubbles Wb in the refrigerant W passing through the reduced diameter portion 20 in the first flow path 3, the temperature of the refrigerant W in the first flow path 3 is supposed to be decreased. The refrigerant W whose temperature has decreased flows into a third flow path 8. Since the temperature of the refrigerant W further decreases in the third flow path 8 in which a reduced diameter portion 9 is formed, the cooling efficiency is improved.

Figure 16:
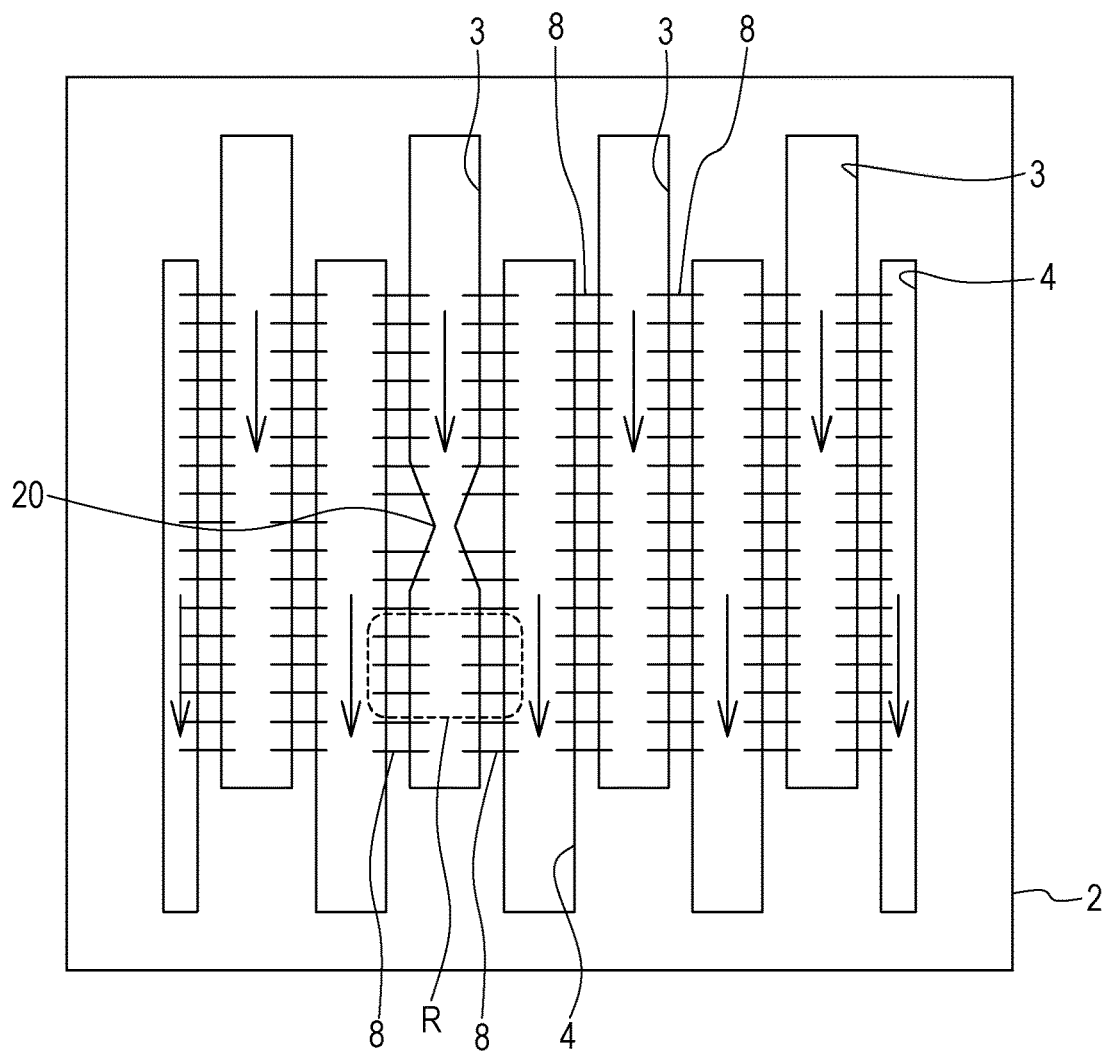
FIG. 16 is an explanatory view illustrating a reduced diameter portion provided in a first flow path.

For example, as illustrated in FIG. 16, the reduced diameter portion 20 can be arranged in the upstream vicinity of a region R desired to be further cooled. This makes it easier to meet the requirement of locally enhancing the cooling effect.

Fifth Embodiment

Figure 17:
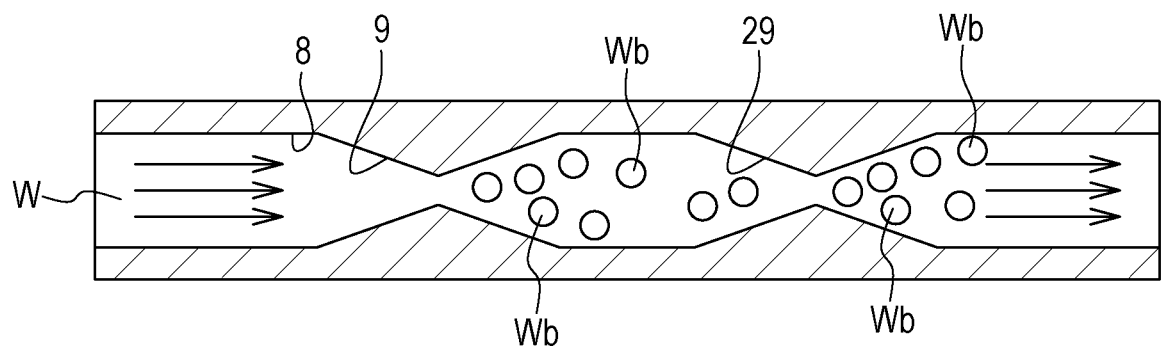
FIG. 17 is an explanatory view illustrating an example including a plurality of reduced diameter portions.

Next, a fifth embodiment will be described with reference to FIG. 17. The fifth embodiment includes a plurality of reduced diameter portions 9 and 29 provided along the flow direction of a third flow path 8. Every time the refrigerant W passes through the reduced diameter portions 9 and 29, the refrigerant W generates the bubbles Wb to decrease the temperature. Consequently, the cooling efficiency may be improved.

Sixth Embodiment

Figure 18:
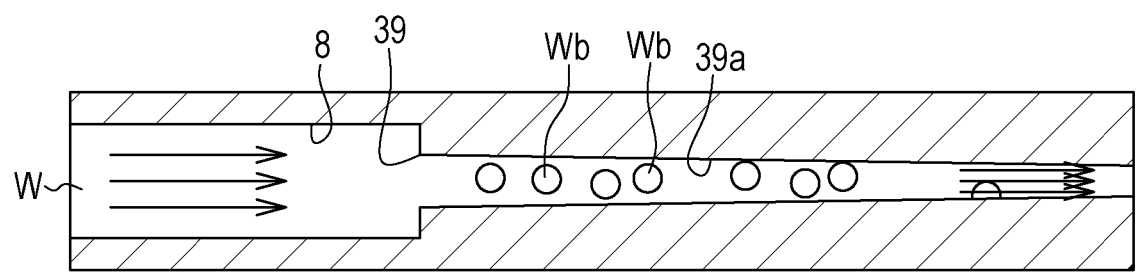
FIG. 18 is an explanatory view illustrating an example including a tapered portion as a reduced diameter portion.

Next, a sixth embodiment will be described with reference to FIG. 18. The sixth embodiment includes a reduced diameter portion 39 having a tapered portion 39a that narrows the flow path diameter of a third flow path gradually toward the downstream side of the third flow path 8. The reduced diameter portion 39 includes the tapered portion 39a, such that the nearer the downstream side, the smaller the flow path diameter. Along with this tapered portion 39a, the velocity of the refrigerant W is made higher and the pressure is decreased; consequently, the bubbles Wb are likely to be generated. As a result, the cooling efficiency may be improved.

Although the preferred embodiments of the present invention have been described in detail thus far, the present invention is not limited to such specific embodiments and various modifications and alterations may be made within the scope of the present invention described in the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A cooling plate comprising:
   a main body portion including a cooling surface;
   a first flow path formed inside the main body portion and configured to receive a refrigerant from a pump side;
   a second flow path formed inside the main body portion, provided so as to be adjacent to the first flow path and configured to discharge the refrigerant to the pump side; and
   a plurality of third flow paths provided closer to a side of the cooling surface than the first flow path and the second flow path in the main body portion and configured to couple the first flow path and the second flow path,
   the plurality of third flow paths have respective reduced diameter portions configured to narrow a flow path diameter of the respective third flow paths, and each of the plurality of third flow paths includes two first portions which extend from one of a first lower surface of the first flow path and a second bottom surface of the second flow path in a first direction perpendicular to the first bottom surface and the second bottom surface and a second portion which extends in a second direction perpendicular to the first direction, couples to each of the first portions at respective ends of the second portion and has the respective reduced diameter portions.

2. The cooling plate according to claim 1, further comprising a bubble discharge flow path between the respective reduced diameter portions and a flow path end portion where the respective third flow paths merges with the second flow path.

3. The cooling plate according to claim 1, wherein the respective reduced diameter portions are a projecting portion which projects toward a center portion of the respective third flow paths.

4. The cooling plate according to claim 1, wherein the respective reduced diameter portions are provided at a plurality of places along a flow direction of the respective third flow paths.

5. The cooling plate according to claim 1, wherein the respective reduced diameter portions are a reduced diameter maintaining portion that maintains a reduced diameter state toward a downstream side of the respective third flow paths.

6. The cooling plate according to claim 1, wherein the respective reduced diameter portions have a tapered portion that narrows a flow path diameter of the respective third flow paths gradually toward a downstream side of the respective third flow paths.

7. The cooling plate according to claim 1, wherein the first flow path includes a reduced diameter portion that narrows a flow path diameter of the first flow path.

8. An information processing device comprising:
an electronic component mounted on a substrate; and
a cooling plate that cools the electronic component, the cooling plate includes:
  a main body portion including a cooling surface that cools the electronic component;
  a first flow path formed inside the main body portion and configured to receive a refrigerant from a pump side;
  a second flow path formed inside the main body portion, provided so as to be adjacent to the first flow path and configured to discharge the refrigerant to the pump side; and
  a plurality of third flow paths provided closer to a side of the cooling surface than the first flow path and the second flow path in the main body portion and configured to couple the first flow path and the second flow path,
the plurality of third flow paths have respective reduced diameter portions configured to narrow a flow path diameter of the respective third flow paths, and each of the plurality of third flow paths includes two first portions which extend from one of a first lower surface of the first flow path and a second bottom surface of the second flow path in a first direction perpendicular to the first bottom surface and the second bottom surface and a second portion which extends in a second direction perpendicular to the first direction, couples to each of the two first portions at respective ends of the second portion and has the respective reduced diameter portions.

9. The information processing device according to claim 8, further comprising a bubble discharge flow path between the respective reduced diameter portions and a flow path end portion where the respective third flow paths merge with the second flow path.

10. The information processing device according to claim 8, wherein the respective reduced diameter a projecting portion which projects toward a center portion of the respective third flow paths.

11. The information processing device according to claim 8, wherein the respective reduced diameter portions are provided at a plurality of places along a flow direction of the respective third flow paths.

12. The information processing device according to claim 8, wherein the respective reduced diameter portions are a reduced diameter maintaining portion that maintains a reduced diameter state toward a downstream side of the respective third flow paths.

13. The information processing device according to claim 8, wherein the respective reduced diameter portions have a tapered portion that narrows a flow path diameter of the respective third flow paths gradually toward a downstream side of the respective third flow paths.

14. The information processing device according to claim 8, wherein the first flow path includes a reduced diameter portion that narrows a flow path diameter of the first flow path.

15. The cooling plate according to claim 1, further comprising:
a bubble discharge flow path provided at a portion in which the flow path diameter which is narrowed at the respective reduced diameter portions returns to an original flow path diameter,
wherein the respective third flow paths branch at the portion in a direction of the bubble discharge flow path and in a direction of the respective third flow paths.

16. The information processing device according to claim 8, further comprising:
a bubble discharge flow path provided at a portion in which the flow path diameter which is narrowed at the respective reduced diameter portions returns to an original flow path diameter,
wherein the respective third flow paths branch at the portion in a direction of the bubble discharge flow path and in a direction of the respective third flow paths.

* * * * *